United States Patent
Lee et al.

(10) Patent No.: US 6,928,023 B2
(45) Date of Patent: Aug. 9, 2005

(54) APPARATUS FOR AND METHOD OF CONTROLLING AIVC THROUGH BLOCK SELECTION INFORMATION IN SEMICONDUCTOR MEMORY DEVICE

(75) Inventors: Ho-Cheol Lee, Yongin (KR); Jung-Soo Ryoo, Sungnam (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 46 days.

(21) Appl. No.: 10/465,553

(22) Filed: Jun. 20, 2003

(65) Prior Publication Data

US 2004/0090854 A1 May 13, 2004

(30) Foreign Application Priority Data

Nov. 11, 2002 (KR) .................................. 10-2002-0069613

(51) Int. Cl.[7] .................................................. G11C 7/00
(52) U.S. Cl. .................................. 365/226; 365/230.06
(58) Field of Search ........................... 365/226, 230.03, 365/230.06, 230.08, 189.08, 191

(56) References Cited

U.S. PATENT DOCUMENTS

| | | | |
|---|---|---|---|
| 5,109,265 A | | 4/1992 | Utesch et al. .................. 357/45 |
| 5,771,200 A | * | 6/1998 | Cho et al. .............. 365/230.03 |
| 6,064,621 A | * | 5/2000 | Tanizaki et al. ........ 365/230.03 |
| 6,125,073 A | | 9/2000 | Le et al. ................. 365/230.03 |
| 6,172,931 B1 | * | 1/2001 | Cha et al. .................... 365/226 |
| 6,229,753 B1 | * | 5/2001 | Kono et al. ............ 365/230.03 |

* cited by examiner

*Primary Examiner*—Richard Elms
*Assistant Examiner*—Hien Nguyen
(74) *Attorney, Agent, or Firm*—Harness, Dickey & Pierce, P.L.C.

(57) ABSTRACT

A method of controlling a bank voltage (AIVC) through memory block selection information, said method comprising the steps of detecting an array block selection signal of an array block disposed distantly from an AIVC driver in response to an activated memory array block selection signal; and supplying a second bank voltage to a memory bank by driving a normal size driver and an oversize driver when detecting the array block selection signal for the distantly disposed array block.

19 Claims, 7 Drawing Sheets

APPARATUS FOR AND METHOD OF CONTROLLING AIVC THROUGH BLOCK SELECTION INFORMATION IN SEMICONDUCTOR MEMORY DEVICE

This U.S. nonprovisional patent application claims priority under 35 U.S.C. § 119 of Korean Patent Application 2002-69613 filed on Nov. 11, 2002, the entire contents of which is hereby incorporated by reference.

FIELD OF THE INVENTION

The present invention relates to a semiconductor memory device, and more particularly, to AIVC control apparatus and method to selectively supply a bank voltage.

DESCRIPTION OF THE RELATED ART

A semiconductor memory device generally includes numerous memory cells. According to U.S. Pat. No. 5,109,265 based on a conventional technology of the semiconductor memory device having such numerous cells, the plurality of memory cells are divided into four memory banks. To provide a supply voltage, different additional voltages are generated in the semiconductor memory device which are then supplied to memory cells.

For example, a substrate bias voltage is supplied to a substrate, a word line voltage is supplied to a word line of a memory bank, and a bit line voltage is supplied to a bit line.

A potential of the substrate is lower than an external voltage source supplied to a semiconductor chip, the word line voltage is externally supplied, and a potential of the bit line is lower than the external voltage source or at a level of the external voltage source.

The respective voltage generators which generate the additional voltages cause a power loss, in particular, the substrate bias voltage and the word line voltage.

According to U.S. Pat. No. 6,125,073 based on a conventional technology of a semiconductor memory device having four divided memory banks and a voltage generator per bank, four divided supply voltage sources are allocated to the four memory banks, and the supply voltage sources generate a word line voltage, a bit line voltage and a substrate voltage. The supply voltage source can supply one or numerous supply voltages in parallel. The supply voltage source transmits a high capacity drive potential if memory bank 1 among the four memory banks is activated. If memory bank 1 has a standby state and one of memory banks 2, 3, 4 is accessed, the supply voltage source supplies a low capacity drive potential.

Figure 1A:
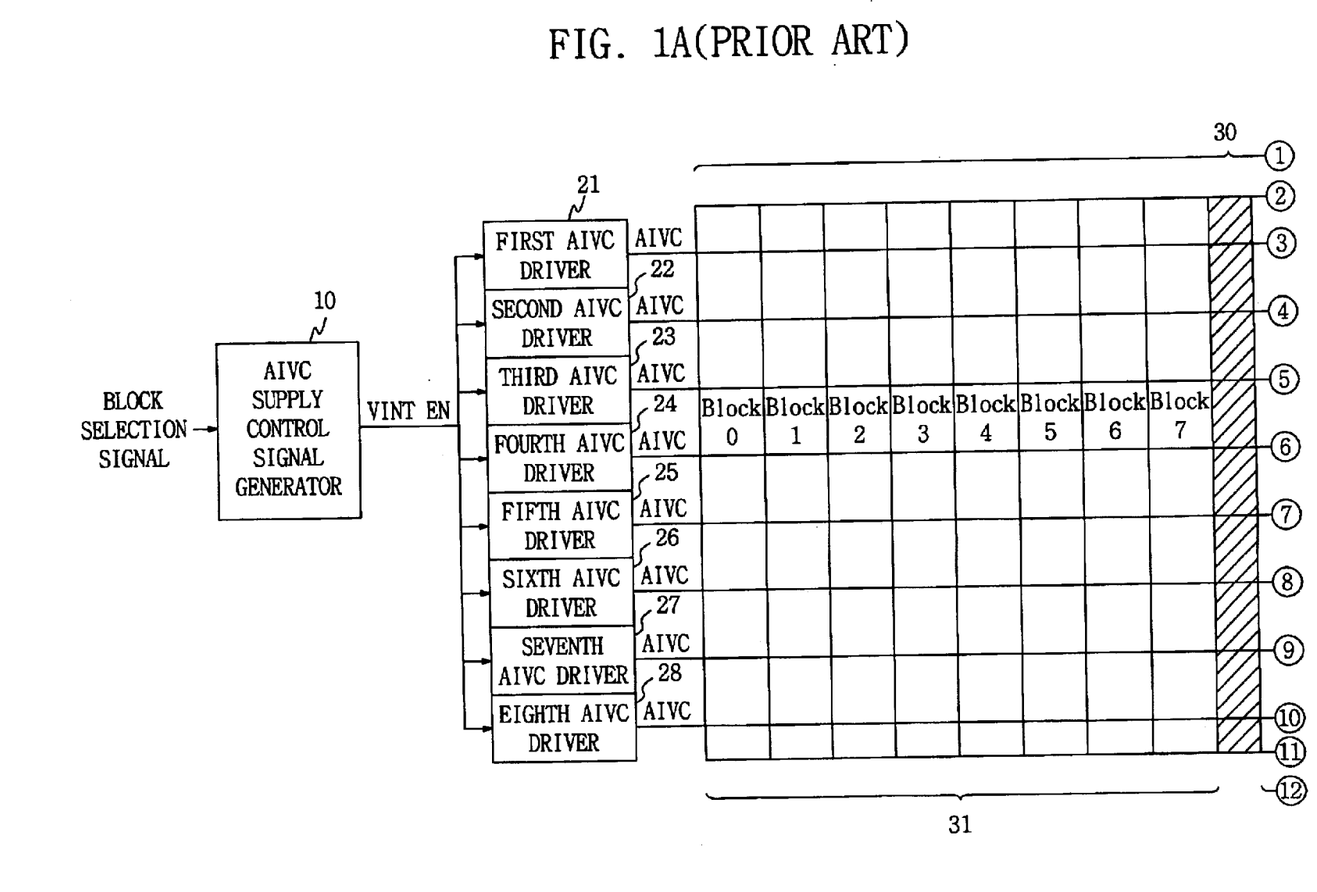
FIGS. 1A and 1B illustrate a block diagram of a bank voltage supply control circuit of a conventional semiconductor memory device.
Figure 1B:
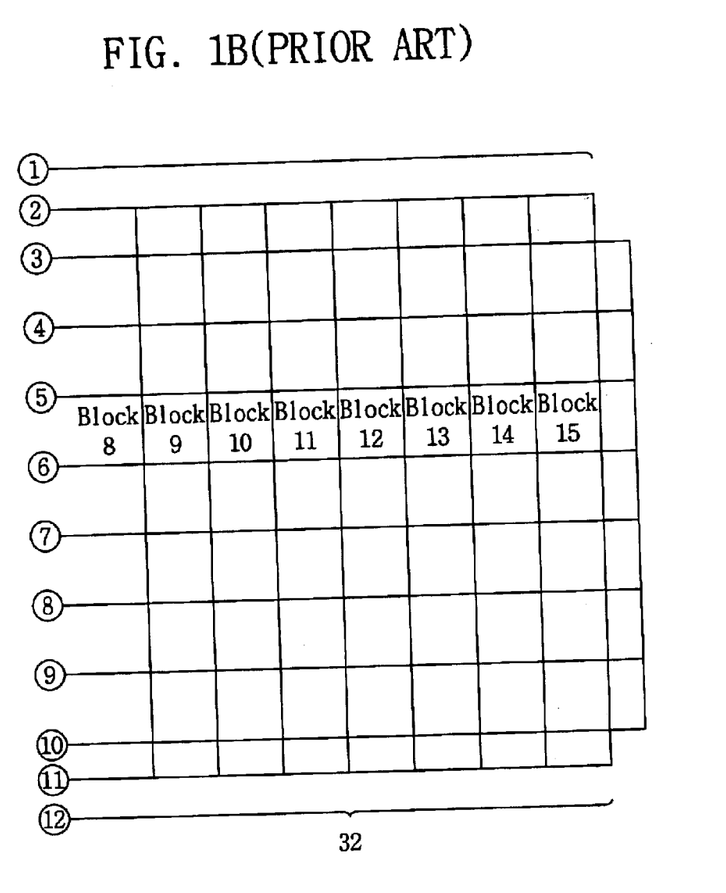

FIGS. 1A and 1B illustrates block diagrams of a bank voltage supply control circuit of a conventional semiconductor memory device.

In FIGS. 1A and 1B, the bank voltage supply control circuit includes a bank voltage (AIVC) supply control signal generator 10 for generating an enable signal VINT EN for an AIVC supply in response to a block selection signal; 1st through 8th AIVC drivers 21~28 for receiving the enable signal VINT EN for the AIVC supply outputted from the AIVC supply control signal generator 10 to supply a bank voltage (AIVC) to a memory bank 30; and the memory bank 30 for respectively receiving the AIVCs supplied from the 1st through 8th AIVC drivers 21~28 to write or read data.

The memory bank 30 includes sixteen blocks Block0~Block15. The sixteen blocks Block0~Block15 are divided into two array blocks, a first array block 31 and a second array block 32.

Figure 2:
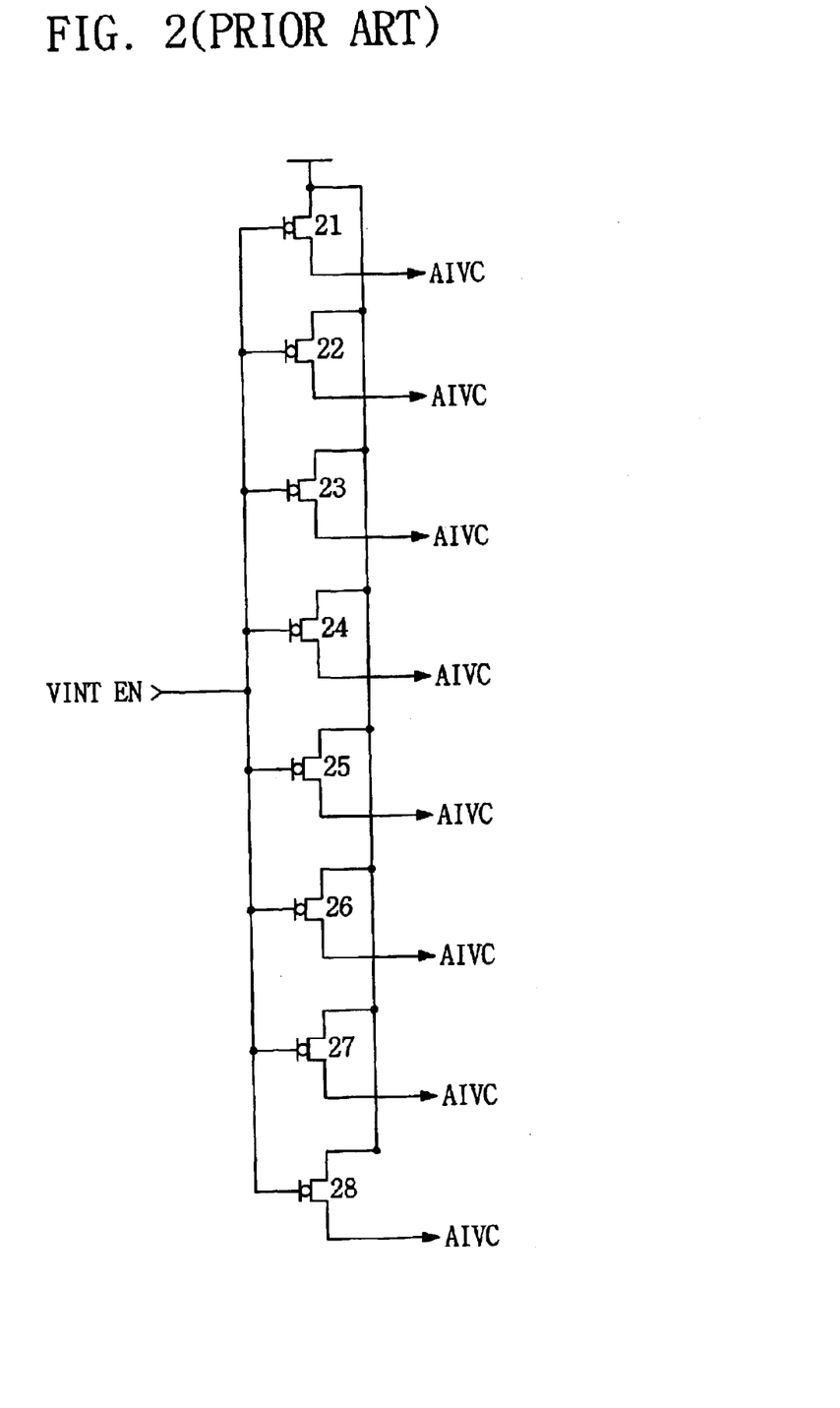
FIG. 2 illustrates a detailed circuit diagram of 1st through 8th AIVC drivers shown in FIG. 1.

FIG. 2 is a detailed circuit drawing of the 1st through 8th AIVC drivers 21~28 shown in FIGS. 1A AND 1B.

The 1st through 8th AIVC drivers 21~28 individually include a PMOS transistor.

The AIVC supply control signal generator 10 generates an enable signal VINT EN for an AIVC supply when a block selection signal is applied. The 1st through 8th AIVC drivers 21~28 receive the enable signal VINT EN for the AIVC supply outputted from the AIVC supply control signal generator 10, and supply the AIVC to the memory bank 30. That is, the 1st through 8th AIVC drivers 21~28 are respectively constructed of PMOS transistors 21~28, and when the enable signal VINT EN for the AIVC supply is applied to a gate, the PMOS transistors 21~28 are turned on to supply the AIVC to the memory bank 30.

In the memory bank 30, the same voltage should be supplied to the first array block 31 and the second array block 32, but in order for normal operation of the second array block 32, due to a length difference between the first array block 31 and the second array block 32, a voltage higher than a normal operating voltage of the first array block 31 must be supplied. Thus, the AIVC from the 1st through 8th AIVC drivers 21~28 at a voltage level to normally operate the second array block 32 of the memory bank 30, is supplied to both the first array block 31 and the second array block 32.

In the bank voltage control circuit 10 of such a conventional semiconductor memory device, the same voltage is supplied regardless of a position of an array block within a bank. Thus, a power overshoot is caused in the first array block 31 near to the 1st through 8th AIVC drivers 21~28 and excess power consumption is caused due to a large capacity of the AIVC drivers.

SUMMARY OF THE INVENTION

Exemplary embodiments of the present invention provide a bank voltage control apparatus using block information, to prevent or reduce the possibility of a bank voltage from overshooting by supplying a voltage corresponding to a position of an array block of a bank.

In another exemplary embodiment, the present invention is directed to a bank voltage control apparatus using block information, to reduce power consumption by determining a driver size and a drive time of an over driver according to a block position through activated block information.

In an exemplary embodiment of the present invention, a bank voltage control apparatus using block information supplies bank voltages of different levels based on a position of array block.

In an exemplary embodiment of the present invention, the method of controlling a bank voltage (AIVC) through memory block selection information, comprises the steps of detecting an array block selection signal of an array block disposed distant from an AIVC driver in response to an activated memory array block selection signal; supplying a second bank voltage to a memory bank by driving a normal size driver and an oversize driver in detecting the array block selection signal of the distantly disposed array block; and supplying a first bank voltage to the memory bank by driving only the normal size driver when an array block selection signal disposed near to the AIVC driver is detected in response to the activated memory array block selection signal.

In another exemplary embodiment of the present invention, the apparatus for controlling an AIVC through memory block selection information, comprises an array block signal detector for detecting a second array block selection signal of a second array block disposed distantly from an AIVC driver in response to a block selection signal; an oversize driver controller for receiving the second array block selection signal detected from the array block signal detector to generate an enable signal for driving an oversize driver; an AIVC supply control signal generator for generating an enable signal for an AIVC supply in response to the block selection signal; and a plurality of AIVC drivers each having a normal size driver and the oversize driver, for receiving the enable signal for the AIVC supply and the enable signal for the drive of the oversize driver, the enable signal for the AIVC supply being outputted from the AIVC supply control signal generator and the enable signal for driving the oversize driver being outputted from the oversize driver controller, and for driving the normal size driver and the oversize driver so as to supply a second bank voltage to a memory bank.

The plurality of AIVC drivers each receive the enable signal for the AIVC supply outputted from the AIVC supply control signal generator when an array block selection signal disposed near to the AIVC driver is detected instead of the second array block selection signal of the distantly disposed array block, and drive only the normal size driver so as to supply the first bank voltage to the memory bank.

In an exemplary embodiment of the present invention, the apparatus for controlling an AIVC through memory block selection information, includes an array block signal detector for detecting a second array block selection signal of a second array block disposed distantly from an AIVC driver in response to a block selection signal; an oversize driver controller for receiving the second array block selection signal detected from the array block signal detector to generate an enable signal for driving an oversize driver; an over driver enable signal generator for receiving the second array block selection signal detected from the array block signal detector to output an over driver enable signal; an over driver pulse width controller for receiving the second array block selection signal detected from the array block signal detector to output an over driver pulse width control signal; an AIVC supply control signal generator for generating an enable signal for an AIVC supply in response to the block selection signal, and controlling and outputting a level of the enable signal for the AIVC supply in response to the over driver pulse width control signal outputted from the over driver pulse width controller when the over driver enable signal is applied from the over driver enable signal generator; and a plurality of AIVC drivers each having a normal size driver and the oversize driver, for receiving the enable signal for the AIVC supply outputted from the AIVC supply control signal generator and the enable signal for the drive of the oversize driver outputted from the oversize driver controller, so as to drive the normal size driver and the oversize driver, and for supplying a third bank voltage to a memory bank.

In another exemplary embodiment, the present invention is directed to a method of controlling a bank voltage comprising the steps of detecting an array block selection signal indicating an array block to which the bank voltage should be applied, varying the block voltage depending on a location of the array block in a memory bank, and supplying the bank voltage to the array block.

In another exemplary embodiment, the present invention is directed to a semiconductor memory device comprising at least one memory bank, including a plurality of array blocks and means for detecting an array block selection signal indicating the array block to which a bank voltage should be applied, varying the block voltage depending on a location of the array block in the memory bank, and supplying the bank voltage to the array block.

BRIEF DESCRIPTION OF THE DRAWINGS

The above and other features of exemplary embodiment of the present invention will become readily apparent by from the description of the exemplary embodiments that follows, with reference to the attached drawing in which.

DETAILED DESCRIPTION OF EXEMPLARY EMBODIMENTS OF THE INVENTION

Hereinafter, exemplary embodiments of the present invention will be described in detail with reference to FIGS. 3 trough 5. In the inventive description, details of widely known functions of constructions will be omitted so as not to obscure the gist of the present invention.

Figure 3A:
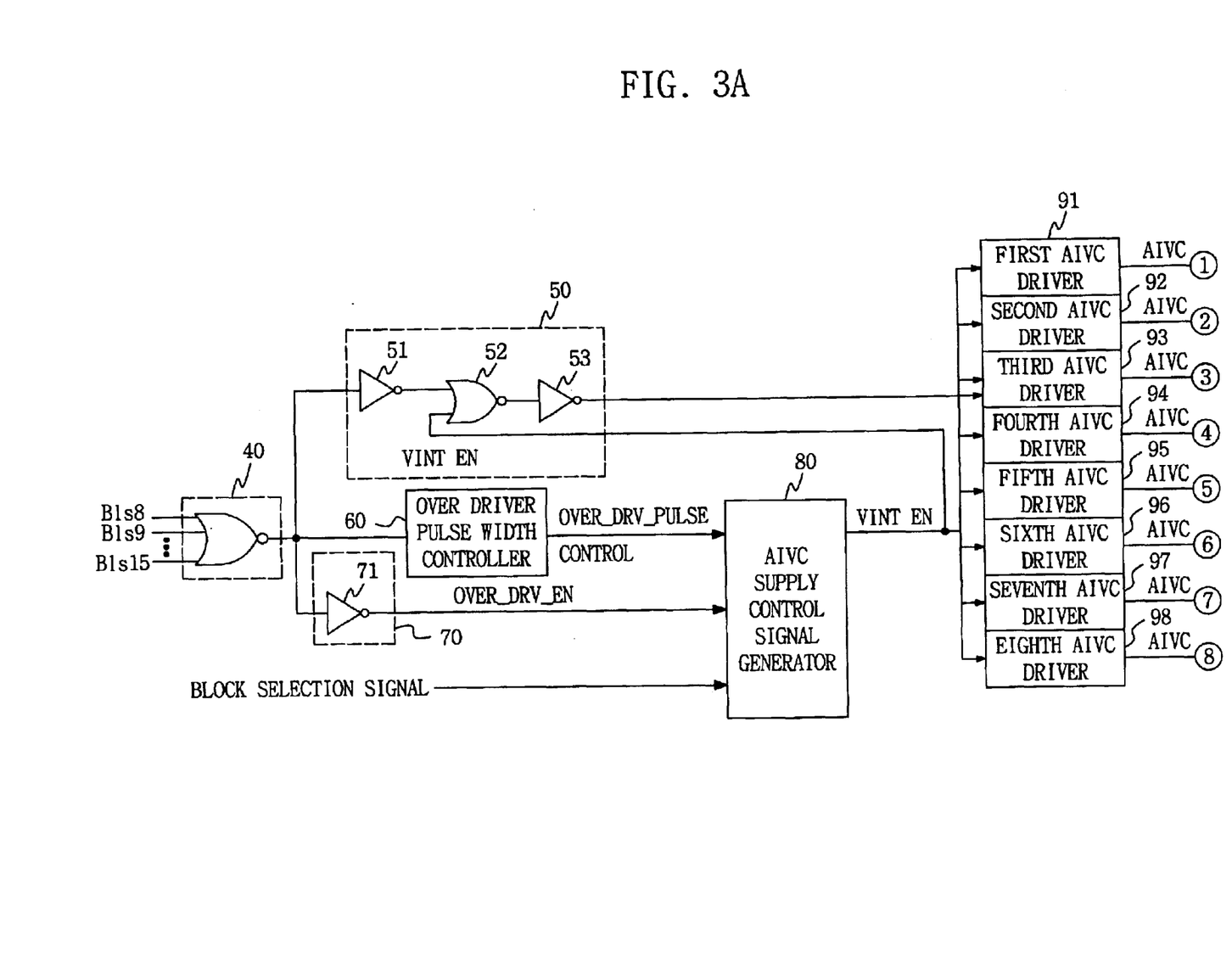
FIGS. 3A and 3B illustrates a block diagram of a bank voltage control apparatus using block information in accordance with an exemplary embodiment of the present invention.
Figure 3B:
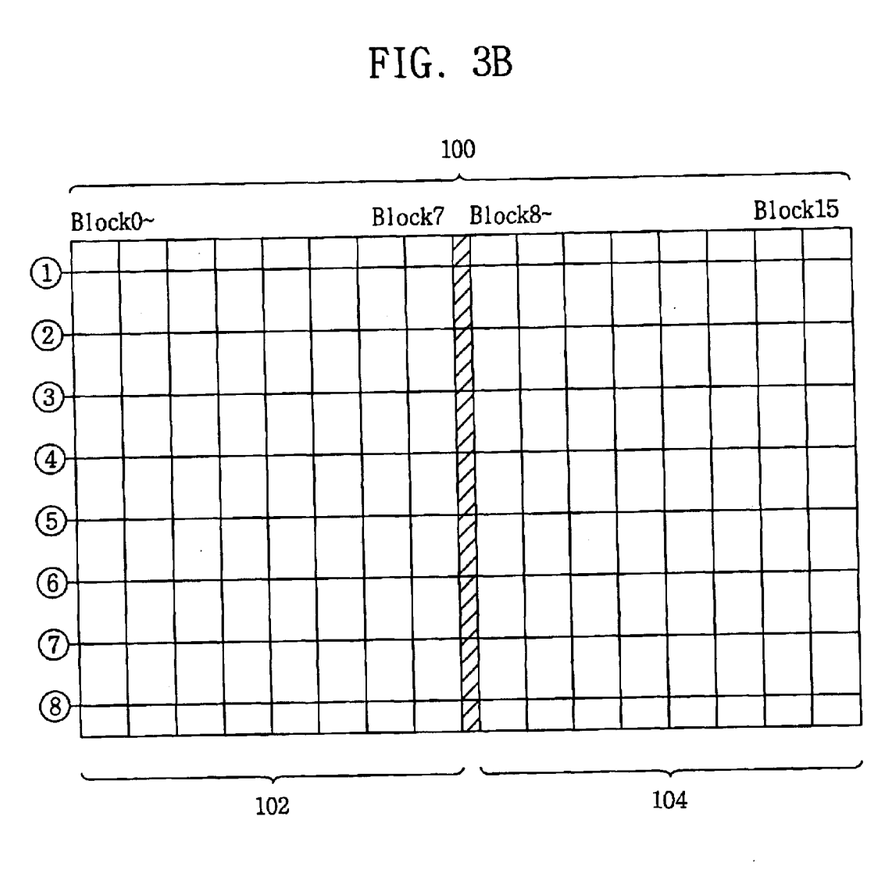

FIGS. 3A AND 3B illustrate a block diagram of a bank voltage control apparatus using block information in accordance with an exemplary embodiment of the present invention.

Referring first to FIGS. 3A AND 3B, the bank voltage (AIVC) control apparatus includes an array block signal detector 40, an oversize driver controller 50, an over driver pulse width controller 60, an over driver enable signal generator 70, an AIVC supply control signal generator 80, 1st through 8th AIVC drivers 91~98, and a memory bank 100.

The array block signal detector 40 receives, inverts and logically sums block selection signals Bls8~Bls15 for blocks Block8~Block15 disposed distant from an AIVC driver, and then produces a second array block selection signal of the memory bank.

The oversize driver controller 50 includes an inverter 51, a NOR gate 52 and an inverter 53, and receives the second array block selection signal produced by the array block signal detector 40 to generate an enable signal.

The over driver pulse width controller 60 receives the second array block selection signal detected from the array block signal detector 40, and outputs an over driver pulse width control signal OVER_DRV_PULSE CONTROL.

The over driver enable signal generator 70 includes an inverter 71 and receives the second array block selection signal detected from the array block signal detector 40, to output an over driver enable signal OVER_DRV_EN.

The AIVC supply control signal generator 80 receives a block selection signal to generate an enable signal VINT EN for a supply of a bank voltage (AIVC). When the over driver enable signal OVER_DRV_EN is applied from the over driver enable signal generator 70 thereto, the AIVC supply control signal generator 80 controls and outputs a level of the enable signal VINT EN for the AIVC supply in response to the over driver pulse width control signal outputted from the over driver pulse width controller 60.

The 1st through 8th AIVC drivers 91~98 receive the enable signal VINT EN for the AIVC supply and the enable signal for a drive of the oversize driver, to supply the AIVC to the memory bank 100, the enable signal for the AIVC supply being outputted from the AIVC supply control signal generator 80 and the enable signal for the drive of the oversize driver being outputted from the oversize driver controller 50.

The memory bank 100 respectively receives the AIVCs supplied from the 1st through 8th AIVC drivers 91~98, to write or read data.

The memory bank 100 includes sixteen blocks Block0~Block15. These sixteen blocks Block0~Block15 are divided into two array blocks, a first array block 102 and a second array block 104.

Figure 4:
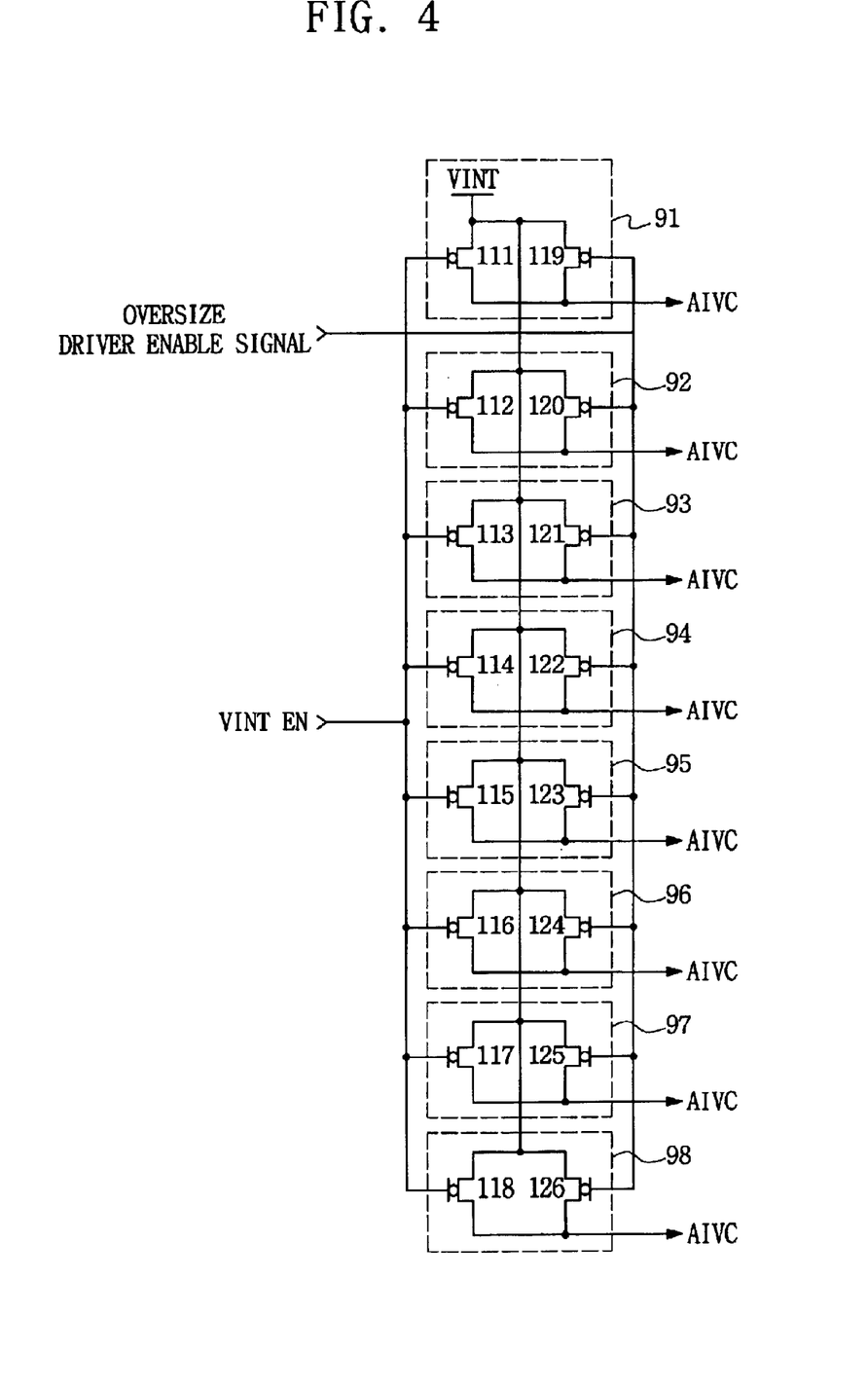
FIG. 4 illustrates an exemplary circuit diagram of 1st through 8th AIVC drivers shown in FIG. 3.

FIG. 4 is a detailed circuit diagram of the 1st to 8th AIVC drivers 91~98 shown in FIGS. 3A and 3B.

In FIG. 4, the 1st through 8th AIVC drivers 91~98 include each of PMOS transistors 111~118 as normal size drivers and each of PMOS transistors 119~126 as oversize drivers. The normal size drivers are the AIVC drivers for supplying the AIVC when the first array block 102 is selected, and the oversize drivers are the AIVC drivers for supplying the AIVC when the second array block 104 is selected.

Figure 5:
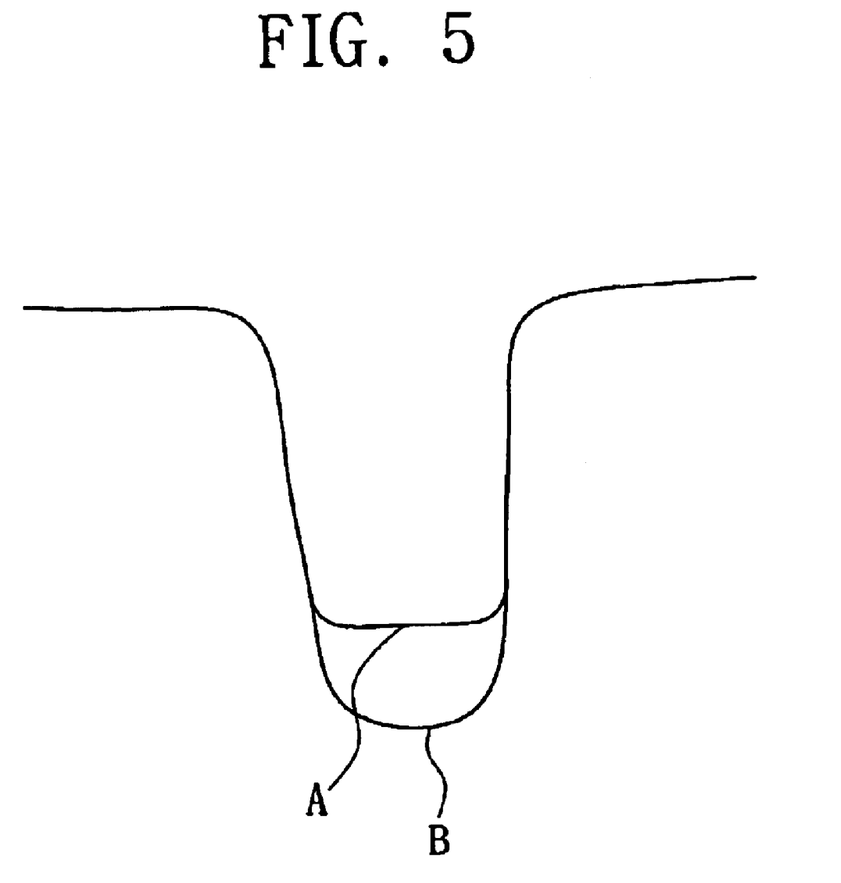
FIG. 5 sets forth an exemplary waveform diagram illustrating a level state of an enable signal for a supply of bank voltage in accordance with an exemplary embodiment of the present invention.

FIG. 5 is a waveform diagram illustrating a level state of the enable signal VINT EN for the AIVC supply in accordance with an exemplary embodiment of the present invention.

Operations related to FIGS. 3 to 5 will be described as follows.

An Exemplary Embodiment

When a memory device is activated, a block selection signal (Blsi) (generated from a low address decoder (not shown), for example) is applied to the AIVC supply control signal generator 80. The AIVC supply control signal generator 80 receives the block selection signal (Blsi), to generate the enable signal VINT EN for the AIVC supply having a level such as A of FIG. 5 and apply the signal to the 1st through 8th AIVC drivers 91~98. In the 1st through 8th AIVC drivers 91~98, the PMOS transistors 111~118 as the normal size drivers are each turned on by the enable signal VINT EN, to apply the signal to the first and second array blocks 102, 104 of the memory bank 100.

When one of blocks Block0~Block7 in the first array block 102 of the memory bank 100 is selected, only the PMOS transistors 111~118 are turned on so as to supply a first bank voltage AIVC1 to the memory bank 100.

When one of eight blocks Block8~Block15 in the second array block 104 of the memory bank 100 is selected, the array block signal detector 40 receives, inverts and logically sums the block selection signals Bls8~Bls15, to produce a second array block selection signal of the memory bank 100. The second array block selection signal detected from the array block signal detector 40 is inverted and outputted through the inverter 51. The signal inverted through the inverter 51 is applied to one input terminal of the NOR gate 52. Then the NOR gate 52 inverts, logically sums and outputs the signal inverted through the inverter 51 and the enable signal VINT EN for the AIVC supply generated from the AIVC supply control signal generator 80. The inverted, logically summed up and outputted signal from the NOR gate 52 is inverted through the inverter 53, and is applied to gates of the PMOS transistors 119~126 as the oversize drivers of the 1st through 8th AIVC drivers 91~98. Thereby all of the PMOS transistors 111~118 as the normal size drivers and the PMOS transistors 119~126 as the oversize drivers are operated, to thus supply the AIVC.

Therefore, when the first array block 102 positioned near to the 1st through 8th AIVC drivers 91~98 is selected, only the PMOS transistors 111~118 as the normal size drivers are operated to supply the first bank voltage AIVC1 so as to prevent or reduce the possibility of overshooting of the AIVC. Also, when the second array block 104 positioned distantly from the 1st through 8th AIVC drivers 91~98 is selected, all of the PMOS transistors 111~118 as the normal size drivers and the PMOS transistors 119~126 as the oversize drivers are operated to supply a second bank voltage AIVC2 so as to prevent or reduce the possibility the AIVC is undesirably reduced.

Another Exemplary Embodiment

Another exemplary embodiment of the present invention has the same operations as the previous exemplary embodiment and additionally has operations for the over driver.

In operation for the over driver, when one of eight blocks Block8~Block15 in the second array block 104 is selected, the array block signal detector 40 receives, inverts and logically sums up the block selection signals Bls8~Bls15 provided from the low address decoder, to thus detect the second array block selection signal of the memory bank. This second array block selection signal becomes a trigger pulse of a high state. The second array block selection signal is inverted through the inverter 71, next is generated as the over driver enable signal OVER_DRV_EN, and is then applied to the AIVC supply control signal generator 80. Thereby, the over driver of the AIVC supply control signal generator 80 is enabled.

Further, the over driver pulse width controller 60 receives the second array block selection signal detected from the array block signal detector 40, and applies the over driver pulse width control signal OVER_DRV_PULSE CONTROL to the AIVC supply control signal generator 80. The AIVC supply control signal generator 80 lowers like B of FIG. 5 a level of the enable signal VINT EN for the AIVC supply in response to the over driver pulse width control signal outputted from the over driver pulse width controller 60, and then outputs the signal, when the over driver enable signal OVER_DRV_EN is applied from the over driver enable signal generator 70.

When one of blocks of the second array block 104 is selected, a level of the enable signal VINT EN for the AIVC supply is lowered like B of FIG. 5. Thus all of the normal size drivers and the oversize drivers of the 1st through 8th AIVC drivers 91~98 are fully turned on so as to increase a level of voltage supplied to the memory bank 100.

Accordingly, when the first array block 102 disposed near to the 1st through 8th AIVC drivers 91~98 is selected, only the PMOS transistors 111~118 as the normal size drivers are operated to supply the first bank voltage AIVC1. When the second array block 104 positioned distantly from the 1st through 8th AIVC drivers 91~98 is selected, the PMOS transistors 111~118 as the normal size drivers and the PMOS transistors 119~126 as the oversize drivers are all operated to supply the second bank voltage AIVC2. Also, when the second array block 104 is selected, the over driver of the AIVC supply control signal generator 80 is driven lower like such as B of FIG. 5 a level of the enable signal VINT EN for the AIVC supply, so as to increase a level of the AIVC and then supply a third bank voltage AIVC3 to the memory bank 100.

Herewith, the level of the first to third bank voltages AIVC1, AIVC2, AIVC3 has a size of AIVC1<AIVC2<AIVC3.

The first and second array blocks 102, 104 divided from the memory bank 100 that is classified into two or more array blocks, can be discriminated with address signals. But, in case redundancy was used, it is difficult to decide the division only with corresponding addresses. In the exemplary embodiment of the present invention, therefore, even though redundancy was used, the AIVC can be accurately controlled, by using not only a corresponding address signal but also information of an actually activated block selection signal Blsi.

Though in the above-mentioned exemplary embodiments of the present invention, the memory bank 100 was divided into two blocks, first and second array blocks, and one oversize driver was used in one AIVC driver; in case a capacity of the memory bank 100 is increased, the present invention can be also embodied without deviating from a scope of the present invention, by dividing the memory bank into three or more array blocks and equipping oversize drivers of the number matched to the number of the divided array blocks with one AIVC driver.

As described above, in exemplary embodiments of the present invention, when an array block positioned near to an AIVC driver is selected, only a normal size driver is operated to supply an AIVC so as to prevent or reduce the possibility of overshooting the AIVC. Also, when an array block positioned distantly from the AIVC driver is selected, both of the normal size driver and the oversize driver are operated to supply the AIVC so as to prevent or reduce the possibility of the AIVC of the distantly positioned array block from being undesirably reduced.

In addition, a size of a driver and a drive time of an over driver can be determined according to a position of a memory array block through activated block information, to reduce power consumption.

Although the present invention was described in detail above in connection with the exemplary embodiments thereof, the scope of the invention is not so limited. Various changes and modifications may be made without departing from the spirit and scope of the invention as defined in the following claims.

What is claimed is:

1. A method of controlling a bank voltage (AIVC) through memory block selection information, said method comprising the steps of:
    detecting an array block selection signal of an array block disposed distantly from an AIVC driver in response to an activated memory array block selection signal; and
    supplying a second bank voltage to a memory bank by driving a normal size driver and an oversize driver when detecting the array block selection signal for the distantly disposed array block.

2. The method of claim 1, further comprising the step of supplying a first bank voltage to the memory bank, by driving only the normal size driver when an array block selection signal of an array block disposed near to the AIVC driver is detected in response to the activated memory array block selection signal.

3. The method of claim 1, further comprising the step of supplying a third bank voltage higher in level, to the memory bank, by driving the oversize driver when the array block selection signal of the near disposed array block is detected.

4. An apparatus for controlling an AIVC through memory block selection information, said apparatus comprising:
    an array block signal detector for detecting a second array block selection signal of a second array block disposed distantly from an AIVC driver in response to a block selection signal;
    an oversize driver controller for receiving the second array block selection signal detected from the array block signal detector to generate an enable signal for driving an oversize driver;
    an AIVC supply control signal generator for generating an enable signal for an AIVC supply in response to the block selection signal; and
    a plurality of AIVC drivers each having a normal size driver and the oversize driver, for receiving the enable signal for the AIVC supply and the enable signal for the drive of the oversize driver, said enable signal for the AIVC supply being outputted from the AIVC supply control signal generator and said enable signal for driving the oversize driver being outputted from the oversize driver controller, and for driving the normal size driver and the oversize driver so as to supply a second bank voltage to a memory bank.

5. The apparatus of claim 4, wherein said plurality of AIVC drivers each receive the enable signal for the AIVC supply outputted from the AIVC supply control signal generator when a first array block selection signal of a first array block disposed near to the AIVC driver is detected instead of the second array block selection signal of the distantly disposed second array block, and drive only the normal size driver so as to supply a first bank voltage to the memory bank.

6. An apparatus for controlling an AIVC through memory block selection information, said apparatus comprising:
    an array block signal detector for detecting a second array block selection signal of a second array block disposed distantly from an AIVC driver in response to a block selection signal;
    an oversize driver controller for receiving the second array block selection signal detected from the array block signal detector to generate an enable signal for driving an oversize driver;
    an over driver enable signal generator for receiving the second array block selection signal detected from the array block signal detector to output an over driver enable signal;
    an over driver pulse width controller for receiving the second array block selection signal detected from the array block signal detector to output an over driver pulse width control signal;
    an AIVC supply control signal generator for generating an enable signal for an AIVC supply in response to the block selection signal, and controlling and outputting a level of the enable signal for the AIVC supply in response to the over driver pulse width control signal outputted from the over driver pulse width controller when the over driver enable signal is applied from the over driver enable signal generator; and
    a plurality of AIVC drivers each having a normal size driver and the oversize driver, for receiving the enable signal for the AIVC supply outputted from the AIVC supply control signal generator and the enable signal for the drive of the oversize driver outputted from the oversize driver controller, so as to drive the normal size driver and the oversize driver, and for supplying a third bank voltage to a memory bank.

7. The apparatus of claim 6, wherein said plurality of AIVC drivers receive the enable signal for the AIVC supply outputted from the AIVC supply control signal generator when a first array block selection signal of a first array block disposed near to the AIVC drivers is detected instead of the second array block selection signal of the distantly disposed second array block, and then drive only the normal size driver so as to supply a first bank voltage to the memory bank.

8. A method of controlling a bank voltage comprising the steps of:
   detecting an array block selection signal indicating an array block to which the bank voltage should be applied;
   varying the block voltage depending on a location of the array block in a memory bank; and
   supplying the bank voltage to the array block.

9. The method of claim 8, wherein said varying step includes increasing the block voltage for the array block if the array block is distant from a bank voltage control circuit.

10. The method of claim 9, wherein said varying step includes applying an over size voltage in addition to the block voltage.

11. The method of claim 8, wherein said method includes driving the array block with the block voltage if the array block is not distant from a bank voltage control circuit and applying an over size voltage in addition to the block voltage if the array block is distant from the bank voltage control circuit.

12. A semiconductor memory device comprising:
    at least one memory bank, including a plurality of array blocks; and
    means for detecting an array block selection signal indicating the array block to which a bank voltage should be applied, varying the block voltage depending on a location of the array block in the memory bank, and supplying the bank voltage to the array block.

13. The semiconductor memory device of claim 12, wherein said means for detecting increases the block voltage for the array block if the array block is distant from a bank voltage control circuit.

14. The semiconductor memory device of claim 13, wherein said means for detecting applies an over size voltage in addition to the block voltage.

15. The semiconductor memory device of claim 12, wherein said means for detecting drives the array block with the block voltage if the array block is not distant from a bank voltage control circuit and applies an over size voltage in addition to the block voltage if the array block is distant from the bank voltage control circuit.

16. The semiconductor memory device of claim 12, said means for detecting including
    an array block signal detector for detecting the array block selection signal for an array block disposed distant from a bank voltage control circuit,
    an oversize driver controller for receiving the array block selection signal detected from the array block signal detector to generate an oversize enable signal,
    an AIVC supply control signal generator for generating an enable signal for an AIVC supply in response to the array block selection signal, and
    a plurality of AIVC drivers each having a normal size driver and an oversize driver, for receiving the enable signal for the AIVC supply and the oversize enable signal, said enable signal for the AIVC supply being output from the AIVC supply control signal generator and said oversize enable signal being output from the oversize driver controller, and for driving the normal size driver and the oversize driver to supply a second bank voltage to a memory bank.

17. The semiconductor memory device of claim 16, said means for detecting further including
    an over driver enable signal generator for receiving the array block selection signal detected from the array block signal detector to output an over driver enable signal, and
    an over driver pulse width controller for receiving the array block selection signal detected from the array block signal detector to output an over driver pulse width control signal,
    said plurality of AIVC drivers receiving the enable signal for the AIVC supply output from the AIVC supply control signal generator and the enable signal for the drive of the oversize driver output from the oversize driver controller, to drive the normal size driver and the oversize driver, and for supplying a third bank voltage to a memory bank.

18. An apparatus for controlling an AIVC through memory block selection information by performing the method of claim 8.

19. A semiconductor memory device including the apparatus for controlling an AIVC through memory block selection information of claim 4.

* * * * *